United States Patent
Kang

(10) Patent No.: US 7,231,472 B2
(45) Date of Patent: Jun. 12, 2007

(54) INPUT/OUTPUT BYTE CONTROL DEVICE USING NONVOLATILE FERROELECTRIC REGISTER

(75) Inventor: Hee Bok Kang, Daejeon (KR)

(73) Assignee: Hynix Semiconductor, Inc., Icheon-si, Gyeonggi-do (KR)

( * ) Notice: Subject to any disclaimer, the term of this patent is extended or adjusted under 35 U.S.C. 154(b) by 488 days.

(21) Appl. No.: 10/738,088

(22) Filed: Dec. 18, 2003

(65) Prior Publication Data

US 2004/0236872 A1   Nov. 25, 2004

(30) Foreign Application Priority Data

May 23, 2003   (KR) ..................... 10-2003-0032900

(51) Int. Cl.
*G06F 3/00* (2006.01)
*G11C 11/22* (2006.01)

(52) U.S. Cl. ............................. 710/62; 710/1; 365/145; 365/201; 365/189.09; 365/230.03

(58) Field of Classification Search .................... 710/1, 710/61; 365/145, 201, 189.09, 230.03
See application file for complete search history.

(56) References Cited

U.S. PATENT DOCUMENTS

| | | | |
|---|---|---|---|
| 5,396,113 A * | 3/1995 | Park et al. ................. 327/543 |
| 6,025,618 A * | 2/2000 | Chen ........................... 257/295 |
| 6,067,244 A | 5/2000 | Ma et al. |
| 6,081,453 A * | 6/2000 | Iwahashi ................ 365/185.22 |
| 6,215,692 B1 * | 4/2001 | Kang .......................... 365/145 |
| 6,262,909 B1 * | 7/2001 | Kye et al. ................... 365/145 |
| 6,272,594 B1 | 8/2001 | Gupta et al. |
| 6,301,145 B1 | 10/2001 | Nishihara |
| 6,314,016 B1 | 11/2001 | Takasu |
| 6,363,439 B1 | 3/2002 | Battles et al. |
| 6,649,955 B2 * | 11/2003 | Lee ............................ 257/295 |
| 6,765,844 B2 * | 7/2004 | Fujisawa et al. ....... 365/230.03 |

FOREIGN PATENT DOCUMENTS

KR     1020040059009 A     7/2004

* cited by examiner

*Primary Examiner*—Tammara Peyton
(74) *Attorney, Agent, or Firm*—Johnny Kumar; Justin Darrow; Heller Ehrman, LLP

(57) ABSTRACT

An input/output byte control device using a nonvolatile ferroelectric register can maintain compatibility with various memories by selectively controlling bytes of input/ output data. Since bytes of input/output data are selectively activated, the compatibility can be maintained with SRAM (Static Random Access Memory) having wide bytes and flash memory having fixed input/output bytes. Additionally, programs can be changed in a software system using a nonvolatile ferroelectric register.

1 Claim, 20 Drawing Sheets

INPUT/OUTPUT BYTE CONTROL DEVICE USING NONVOLATILE FERROELECTRIC REGISTER

BACKGROUND OF THE INVENTION

1. Field of the Invention

The present invention generally relates to an input/output byte control device using a nonvolatile ferroelectric register, and more specifically, to a technology for changing input/output bytes of a memory device depending on program commands with a nonvolatile ferroelectric register.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

The conventional memory device inputs/outputs bits or bytes of data accessed by one address through a data input/output buffer. The memory device loads bits or bytes of data by a system bus.

In the conventional memory device, when required data is a part of bits or bytes, the rest bits or bytes are used to drive the bus unnecessarily. As a result, a bandwidth of the whole system bus is wasted by the rest bits or bytes.

In addition, the conventional memory device has a fixed memory input/output data width. Therefore, the conventional memory device cannot be applied to various systems of different bandwidths. If a conventional memory having a different bandwidth from a system is to be used additional interface equipment is required so that the conventional memory device may become compatible with the system.

SUMMARY OF THE INVENTION

Accordingly, it is an object of the present invention to selectively control byte size of input/output data with a nonvolatile ferroelectric register, thereby maintaining the compatibility with various memories such as SRAM and flash memory.

It is another object of the present invention to control byte size by programming a nonvolatile ferroelectric register.

In an embodiment, an input/output byte control device using a nonvolatile ferroelectric register comprises an input/output byte controller and a byte conversion switching means. The input/output controller outputs a plurality of control signals depending on byte information of input/output data programmed in a nonvolatile ferroelectric register. The byte conversion switching means transmits input/output data having variable byte size between a common data bus and a pad array comprising an upper byte region and a lower byte region in response to the plurality of control signals.

In another embodiment, an input/output byte control device using a nonvolatile ferroelectric register comprises a common data bus controller, a byte conversion switching unit, an input/output buffer, an upper byte pad array and an input/output byte controller. The common data bus controller controls data inputted/outputted in a common data bus unit connected to a plurality of cell array blocks. The byte conversion switching unit selectively connects one of an upper byte bus and a lower byte bus to a lower byte input/output bus in response to a selecting enable signal. The input/output buffer comprises a lower byte input/output buffer connected to the lower byte input/output bus and an upper byte input/output buffer connected to the upper byte bus. The upper byte pad array comprises a lower byte pad array for inputting/outputting data of the lower byte input/output buffer and an upper byte pad array for inputting/outputting data of the upper byte input/output buffer. The input/output byte controller outputs control signals to selectively activate byte size of the pad array unit depending on a code programmed in a nonvolatile ferroelectric register.

The input/output byte control device using a nonvolatile ferroelectric register according to an embodiment of the present invention has characteristics of both volatile SRAMs and nonvolatile flash memories. In a nonvolatile ferroelectric memory cell according to an embodiment of the present invention, the characteristics of SRAMs and flash memories can be simultaneously embodied in a single chip. In the SRAMs, a plurality of byte buses are selectively controlled using wide bytes. When the input/output byte control device is applied to a flash memory, data can be inputted/outputted using a single byte bus.

DETAILED DESCRIPTION OF THE PREFERRED EMBODIMENTS

The present invention will be described in detail with reference to the accompanying drawings.

Figure 1:
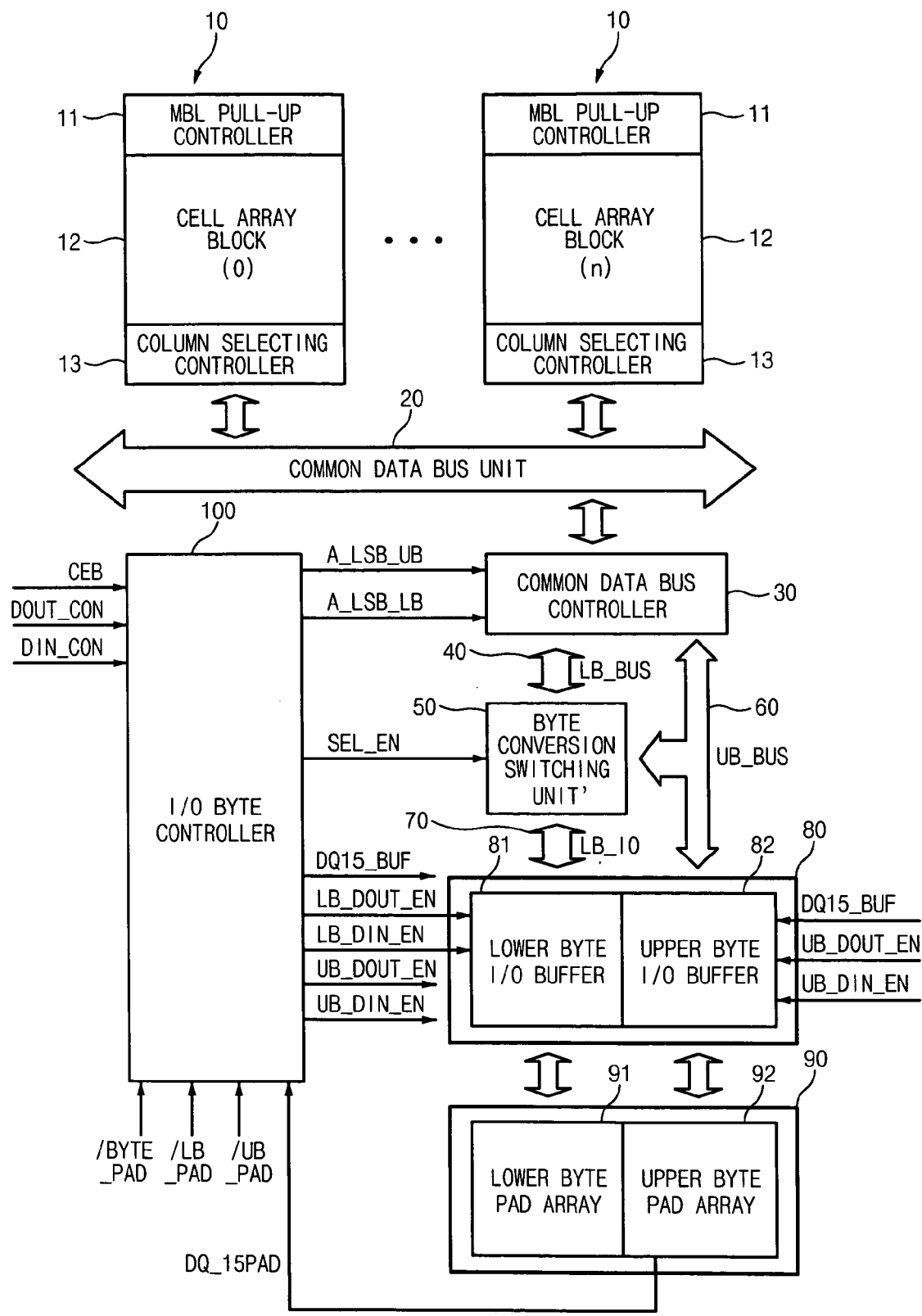
FIG. 1 is a diagram of an input/output byte control device using a nonvolatile ferroelectric register according to an embodiment of the present invention.

FIG. 1 is a diagram of an input/output byte control device using a nonvolatile ferroelectric register according to an embodiment of the present invention.

In an embodiment, the input/output byte control device using a nonvolatile ferroelectric register comprises a common data bus controller 30, a byte conversion switching unit 50, an input/output buffer 80, a pad array unit 90 and an input/output byte controller 100.

Each of a plurality of cell arrays 10 which comprises a main bitline pull-up controller 11, a cell array block 12 and a column selecting controller 13 is connected in common to a common data bus unit 20.

The common data bus controller 30 controls data inputted/outputted in the common data bus unit 20 in response to an upper byte least significant address A_LSB_UB and a lower byte least significant address A_LSB_LB applied from the input/output byte controller 100.

In a write mode, the lower byte least significant address A_LSB_LB and the upper byte least significant address A_LSB_UB regulate activation of upper bytes or lower bytes to prevent upper byte data unavailable to a memory cell from being written.

The common data bus controller 30 is connected to the common data bus controller 30 through a lower byte bus 40. The common data bus controller 30 is connected to the byte conversion switching unit 50 and the input/output buffer 80 through an upper byte bus 60.

The byte conversion switching unit 50 selects one of the upper byte bus 60 and the lower byte bus 40 in response to a selecting enable signal SEL_EN applied from the input/output byte controller 100.

The input/output buffer 80 comprises a lower byte input/output buffer 81 and an upper byte input/output buffer 82. The lower byte input/output buffer 81 selectively outputs data into a lower byte input/output bus 70 in response to a lower byte output enable signal LB_DOUT_EN and a lower byte input enable signal LB_DIN_EN applied from the input/output byte controller 100.

The upper byte input/output buffer 82 selectively inputs/outputs data into the upper byte bus 60 in response to a pad converting signal DQ15_BUF, an upper byte output enable signal UB_DOUT_EN and an upper byte input enable signal UB_DIN_EN applied from the input/output byte controller 100.

The pad array unit 90 comprises a lower byte pad array 91 and an upper byte pad array 92. The lower byte pad array 91 is connected to the lower byte input/output buffer 81 while the upper byte pad array 92 is connected to the upper byte input/output buffer 82. The upper byte pad array 92 exchanges a pad signal DQ_15PAD for selectively activating upper bytes with the input/output byte controller 100.

The input/output byte controller 100 outputs control signals for selectively activating upper/lower bytes in response to a chip enable signal CEB, a data output control signal DOUT_CON, a data input control signal DIN_CON, a byte pad signal /BYTE_PAD, a lower byte pad signal /LB_PAD and an upper byte pad signal /UB_PAD.

When the input/output byte control device is applied to a flash memory, upper bytes can be converted into lower bytes with the byte pad signal /BYTE_PAD. When the input/output byte control device is applied to a SRAM, upper or lower bytes can be selected with the lower byte pad signal /LB_PAD or the upper byte pad signal /UP_PAD.

Figure 2A:
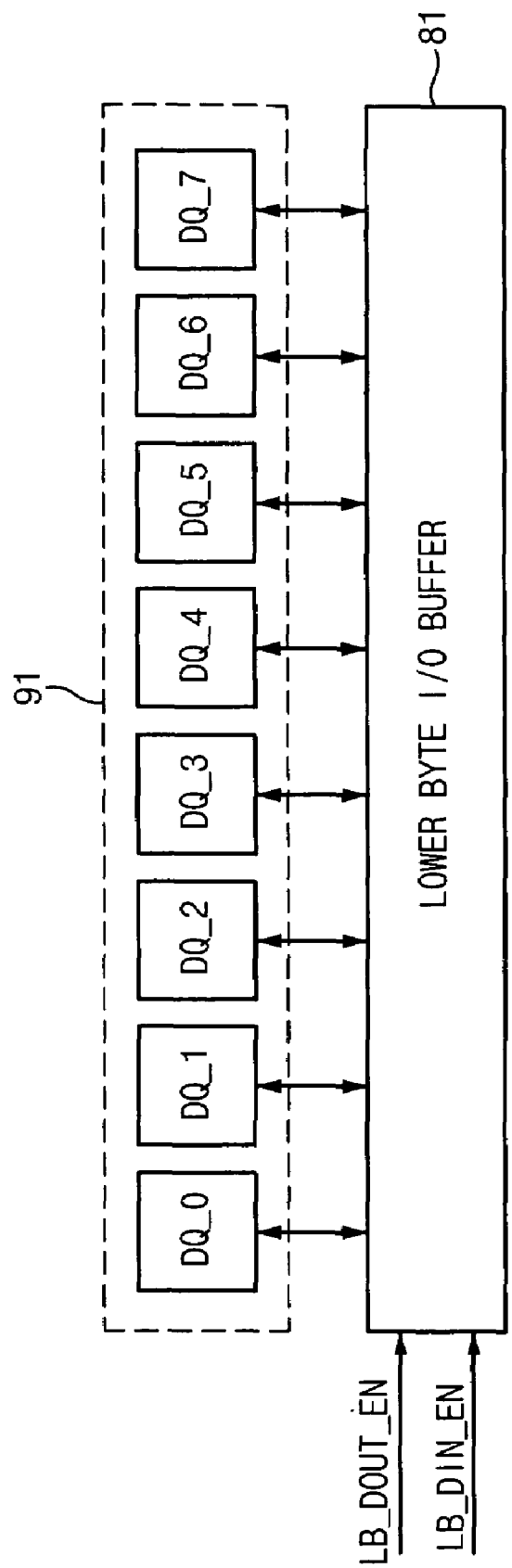
FIGS. 2a and 2b are diagrams of an input/output buffer and a pad array unit of FIG. 1.
Figure 2B:
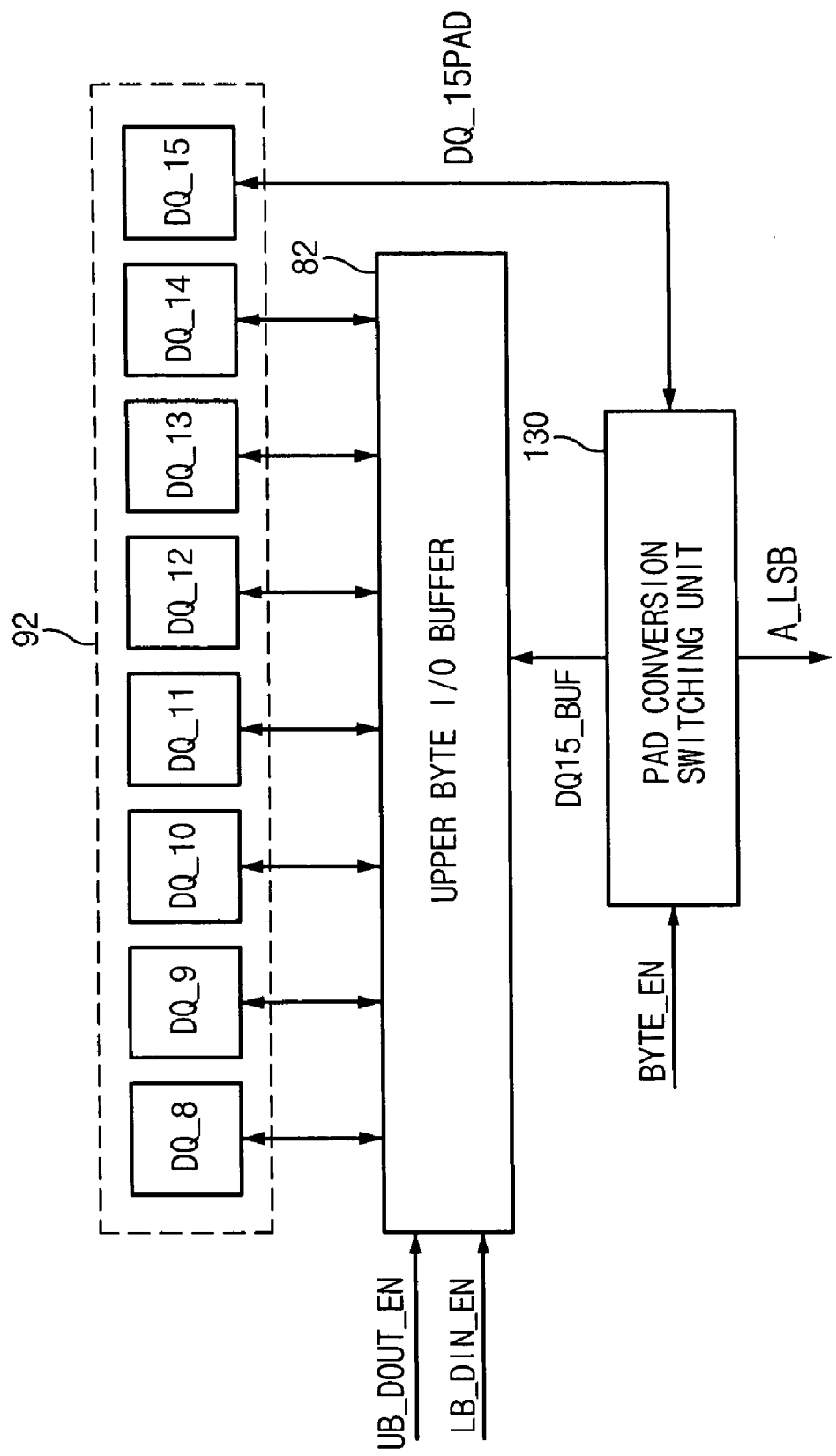

FIGS. 2a and 2b are diagrams of the input/output buffer 80 and the pad array unit 90 of FIG. 1.

Referring to FIG. 2a, the lower byte pad array 91 is connected to the lower byte input/output buffer 81. If a byte size of input/output data (8 bit) is 2 byte (16 bits), the input/output data from <0> to <7> corresponding to the lower bytes. Thus, the lower byte pad array 91 comprises 8 data input/output pins DQ_0~DQ_7.

The lower byte input/output buffer 81 buffers data applied from the data input/output pins DQ_0~DQ_7 in response to the lower byte output enable signal LB_DOUT_EN and the lower byte input enable signal LB_DIN_EN.

Referring to FIG. 2b, the upper byte pad array 92 is connected to the upper byte input/output buffer 82. If a byte size of input/output data is 2 byte (16 bits), the input/output data from <8> to <15> correspond to the upper bytes. Thus, the upper byte pad array 92 comprises 8 data input/output pins DQ_8~DQ_15.

The upper byte input/output buffer 82 buffers data applied from the data input/output pins DQ_8~DQ_15 in response to the upper byte output enable signal UB_DOUT_EN and the upper byte input enable signal UB_DIN_EN.

That is, when 2 byte data are inputted/outputted, the lower byte input/output buffer 81 and the upper byte input/output buffer 82 both operate to use the 2 byte data (16 bits) inputted/outputted from the data input/output pins DQ_0~DQ_15 as addresses. When single byte (1 byte) data is inputted/outputted, the lower byte input/output buffer 81 or the upper byte input/output buffer 82 operates. As a result, lower byte (8 bits) data applied from the data input/output pins DQ_0~DQ_7 are used as addresses, or upper byte (8 bits) data applied from the data input/output pins DQ_8~DQ15 are used as addresses.

The data input/output pin DQ_15 of the upper byte pad array 92 is used to select an upper or lower address. The pad signal DQ_15PAD which is the least significant bit applied from the data input/output pin DQ_15 of the upper byte pad array 92 is inputted/outputted in a pad conversion switching unit 130 comprised in the input/output byte controller 100. Here, the pad signal DQ_15PAD designates an address to selectively activate an upper byte.

The pad conversion switching unit 130 controls an upper byte pad or a lower byte pad in response to a byte enable signal BYTE_EN, and outputs the pad converting signal DQ15_BUF into the upper byte input/output buffer 82. When the byte enable signal BYTE_EN is activated, the pad conversion switching unit 130 outputs the pad converting signal DQ15_BUF into the upper byte input/output buffer 82. On the other hand, when the byte enable signal BYTE_EN is inactivated, the pad conversion switching unit 130 outputs a least significant address A_LSB into a least significant address decoder 140.

Figure 3:
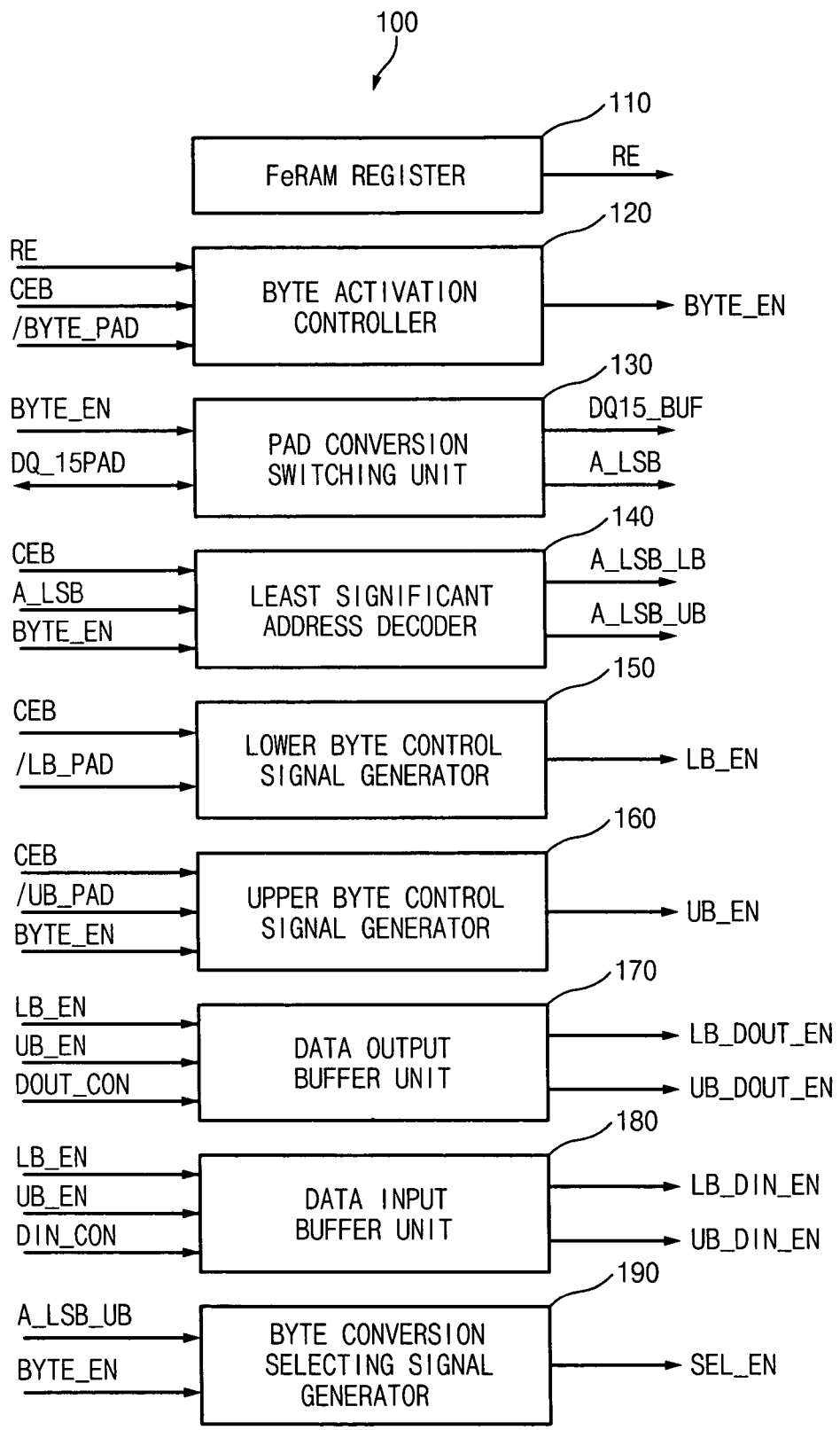
FIG. 3 is a diagram of an input/output byte controller of FIG. 1.

FIG. 3 is a diagram of the input/output byte controller 100 of FIG. 1.

The input/output byte controller 100 comprises a FeRAM register 100, a byte activation controller 120, a pad conversion switching unit 130, a least significant address decoder 140, a lower byte control signal generator 150, an upper byte control signal generator 160, a data output buffer unit 170, a data input buffer unit 180 and a byte conversion selecting signal generator 190.

The FeRAM register 100 codes command signals for controlling byte size of input/output data depending on characteristics of the memory device, and outputs a register control signal RE. The byte activation controller 120 controls the byte enable signal BYTE_EN in response to the register control signal RE, the chip enable signal CEB and the byte pad signal /BYTE_PAD.

The pad conversion switching unit 130 outputs the pad signal DQ_15PAD applied from the upper byte pad array 92 as the pad converting signal DQ15_BUF or the least address A_LSB in response to the byte enable signal BYTE_EN. The least significant address decoder 140 outputs the lower byte least significant address A_LSB_LB and the upper byte least significant address A_LSB_UB in response to the chip enable signal CEB, the least significant address A_LSB and the byte enable signal BYTE_EN.

The lower byte control signal generator 150 outputs a lower byte enable signal LB_EN in response to the chip enable signal CEB and the lower byte pad signal /LB_PAD. The upper byte control signal generator 160 outputs an upper byte enable signal UB_EN in response to the chip enable signal CEB and the lower byte pad signal /UB_PAD.

The data output buffer unit 170 outputs the lower byte output enable signal LB_DOUT_EN and the upper byte output enable signal UB_DOUT_EN in response to the lower byte enable signal LB_EN, the upper byte enable signal UB_EN and the data output control signal DOUT_CON. The data input buffer unit 180 outputs the lower byte input enable signal LB_DIN_EN and the upper byte input enable signal UB_DIN_EN in response to the lower byte enable signal LB_EN, the upper byte enable signal UB_EN and the data input control signal DIN_CON.

The byte conversion selecting signal generator 190 outputs a selecting enable signal SEL_EN in response to the upper byte least significant address A_LSB_UB and the byte enable signal BYTE_EN.

Figure 4:
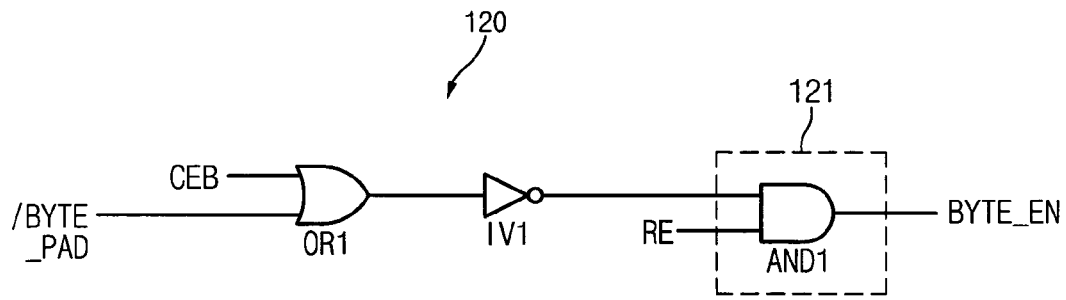
FIG. 4 is a circuit diagram of a byte activation controller of FIG. 3.

FIG. 4 is a circuit diagram of the byte activation controller 120 of FIG. 3.

The byte activation controller 120 comprises an OR gate OR1, an inverter IV1 and a byte activation controller 121.

The OR gate OR1 performs an OR operation on the chip enable signal CEB and the byte pad signal /BYTE_PAD. The inverter IV1 inverts an output signal from the OR gate OR1. The byte activation controller 121 comprises an AND gate AND1 for performing an AND operation on the register control signal RE and an output signal from the inverter IV1 to output the byte enable signal BYTE_EN.

The byte enable signal BYTE_EN is outputted with a high level when one of an upper byte or a lower byte is activated. Here, the input/output byte control device can be applied to a SRAM wherein upper bytes or lower bytes are selectively used. As a result, the input/output byte controller 100 can select one of the upper byte or the lower byte with the byte pad signal /BYTE_PAD.

The byte enable signal BYTE_EN is outputted with a low level when the upper byte and the lower byte are all activated. Here, the input/output byte control device can be applied to a flash memory having a fixed byte of input/output data. As a result, the input/output byte controller 100 can convert upper bytes into lower bytes with the lower byte pad signal /LB_PAD and the upper byte pad signal /UB_PAD.

When the chip enable signal CEB and the byte size pad signal /BYTE_PAD are at a low level, and the register control signal RE is at a high level, the byte enable signal BYTE_EN is outputted with a high level.

Figure 5:
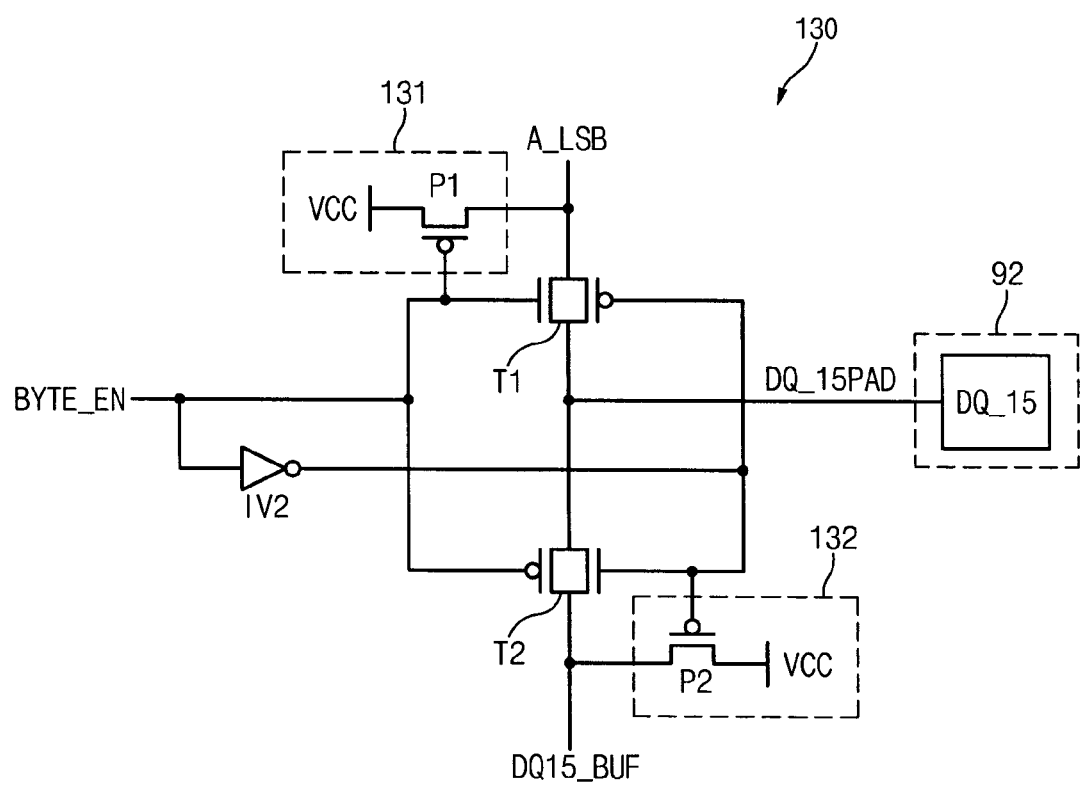
FIG. 5 is a circuit diagram of a pad conversion switching unit of FIG. 3.

FIG. 5 is a circuit diagram of the pad conversion switching unit 130 of FIG. 3.

The pad conversion switching unit 130 comprises an inverter IV2, pull-up units 131 and 132 and transmission gates T1 and T2.

The inverter IV2 inverts the byte enable signal BYTE_EN. The transmission gates T1 and T2 are connected with an opposite polarity from each other, and one of the transmission gates T1 and T2 is selectively turned on.

The pull-up unit 131 comprises a PMOS transistor P1. When the byte enable signal BYTE_EN is inactivated, the PMOS transistor P1 is turned on to pull up an output terminal of the least significant address A_LSB to a power voltage VCC. The pull-up unit 132 comprises a PMOS transistor P2. When the byte enable signal BYTE_EN is activated, the PMOS transistor P2 is turned on to pull up an output terminal of the pad converting signal DQ15_BUF to the power voltage VCC.

That is, when the byte enable signal BYTE_EN is activated, the transmission gate T1 is turned on to output the pad signal DQ_15PAD as the least significant address A_LSB. Here, the pull-up unit 131 is kept turned off, and the pull-up unit 132 is activated to pull up the output terminal of the pad converting signal DQ15_BUF in a floating state to a high level.

When the byte enable signal BYTE_EN is activated, the pad conversion switching unit 130 assigns the pad signal DQ_15PAD of the upper byte to the least significant address A_LSB, thereby enabling all memory regions corresponding to address size to be used.

When the byte enable signal BYTE_EN is inactivated, the transmission gate T2 is turned on to output the pad signal DQ_15PAD as the pad converting signal DQ15_BUF. Here, the pull-up unit 132 is kept turned off, and the pull-up unit 131 pulls up the output terminal of the least significant address A_LSB in a floating state to a high level.

Figure 6:
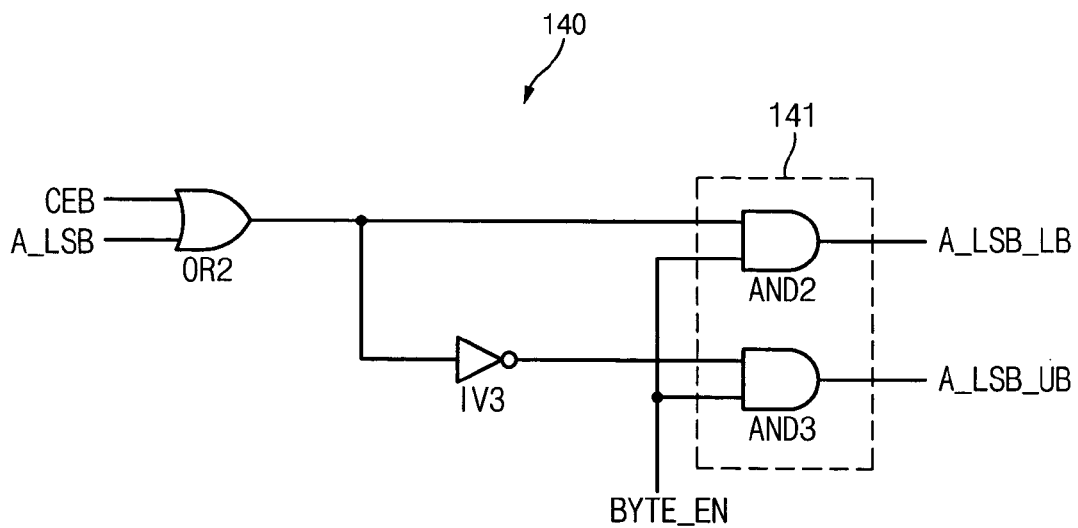
FIG. 6 is a circuit diagram of a least significant address decoder of FIG. 3.

FIG. 6 is a circuit diagram of the least significant address decoder 140 of FIG. 3.

The least significant decoder 140 comprises an OR gate OR2, an inverter IV3 and a logic operation unit 141. Here, the logic operation unit 141 comprises AND gates AND2 and AND3.

The OR gate OR2 performs an OR operation on the chip enable signal CEB and the least significant address A_LSB. The inverter IV3 inverts an output signal from the OR gate OR2. The AND gate AND2 performs an AND operation on an output signal from the OR gate OR2 and the byte enable signal BYTE_EN to output the lower byte least significant address A_LSB_LB. The AND gate AND3 performs an AND operation on an output signal from the inverter IV3 and the byte enable signal BYTE_EN to output the upper byte least significant address A_LSB_UB.

Here, the lower byte least significant address A_LSB_LB is to activate lower bytes. The upper byte least significant address A_LSB_UB is to activate upper bytes.

In the least significant address decoder 140, the lower byte least significant address A_LSB_LB and the upper byte least significant address A_LSB_UB become all at a low level when the byte enable signal BYTE_EN is inactivated. However, when the byte enable signal BYTE_EN is activated, the lower byte least significant address A_LSB_LB becomes at a high level.

The byte enable signal BYTE_EN is outputted with a high level when one byte of the upper byte or the lower byte is activated. When the upper byte and the lower byte are all activated, the byte enable signal BYTE_EN is outputted with a low level. If the byte enable signal BYTE_EN is at an inactive state, each upper byte or lower byte is individually controlled.

When the upper byte and the lower byte are all usable, the lower byte pad signal /LB_PAD is to control activation of lower bytes, and the upper byte pad signal /UB_PAD is to control activation of upper bytes.

Figure 7:
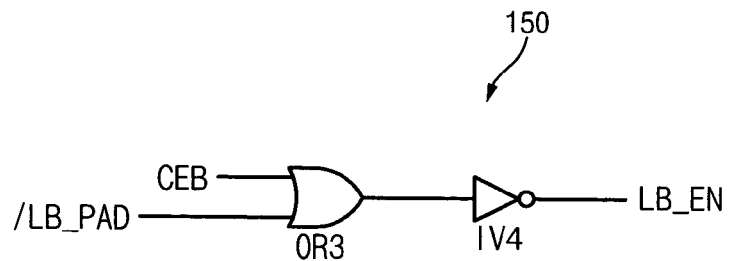
FIG. 7 is a circuit diagram of a lower byte control signal generator of FIG. 3.

FIG. 7 is a circuit diagram of the lower byte control signal generator 150 of FIG. 3.

The lower byte control signal generator 150 comprises an OR gate OR3 and an inverter IV4. The OR gate OR3 performs an OR operation on the chip enable signal CEB and the lower byte pad signal /LB_PAD. The inverter IV4 inverts an output signal from the OR gate OR3 to output the lower byte enable signal LB_EN corresponding to the least significant byte. The lower byte pad signal /LB_PAD is not controlled by the byte enable signal BYTE_EN.

When the lower byte pad signal /LB_PAD is at a low level, the lower byte enable signal LB_EN becomes at a high level to activate the least significant byte. However, when the lower byte pad signal /LB_PAD is at a high level, the lower byte enable signal LB_EN becomes at a low level to inactivate the least significant byte.

Figure 8:
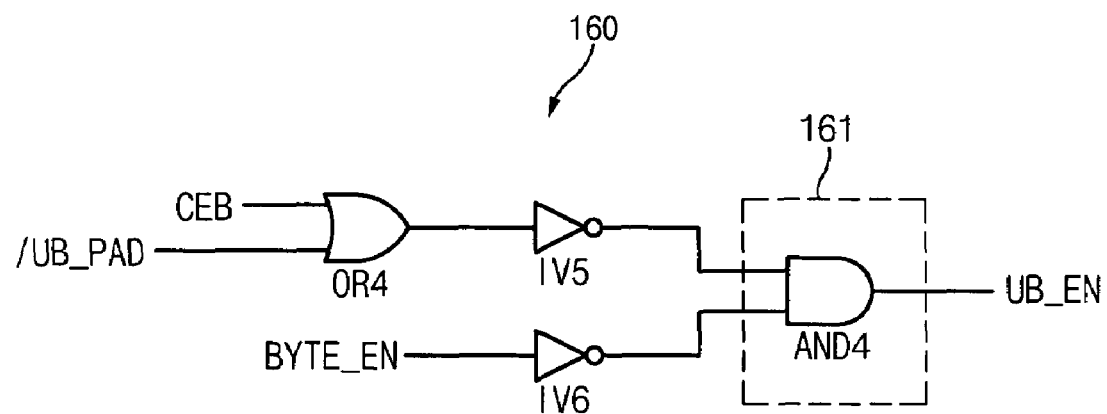
FIG. 8 is a circuit diagram of an upper byte control signal generator of FIG. 3.

FIG. 8 is a circuit diagram of the upper byte control signal generator 160 of FIG. 3.

The upper byte control signal generator 160 comprises an OR gate OR4, inverters IV5 and IV6 and an upper byte activation controller 161.

The OR gate OR4 performs an OR operation on the chip enable signal CEB and the upper byte pad signal /UB_PAD. The inverter IV5 inverts an output signal from the OR gate OR4. The inverter IV6 inverts the byte enable signal BYTE_EN. The upper byte activation control unit 161 performs an AND operation on output signals from the inverters IV5 and IV6 to output the upper byte enable signal UB_EN.

When the byte enable signal BYTE_EN is at a high level, the upper byte enable signal UB_EN is inactivated. However, when the byte enable signal BYTE_EN is at a low level, the upper byte enable signal UB_EN is activated in response to the upper byte pad signal /UB_PAD.

If the upper byte pad signal /UB_PAD is at a low level, the upper byte enable signal UB_EN becomes at a high level to activate the upper byte. However, if the upper byte pad signal /UB_PAD is at a high level, the upper byte enable signal UB_EN becomes at a low level to inactivate the upper byte.

Figure 9:
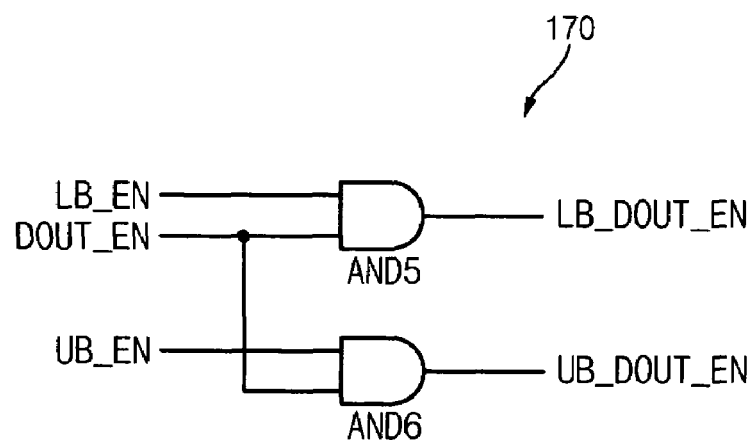
FIG. 9 is a circuit diagram of a data output buffer unit of FIG. 3.

FIG. 9 is a circuit diagram of the data output buffer unit 170 of FIG. 3.

The data output buffer unit 170 comprises AND gates AND5 and AND6.

The AND gate AND5 performs an AND operation on the lower byte enable signal LB_EN and the data output control signal DOUT_CON to output the lower byte output enable signal LB_DOUT_EN. The AND gate AND6 performs an AND operation on the upper byte enable signal UB_EN and the data output control signal DOUT_CON to output the upper byte output enable signal UB_DOUT_EN.

The data output buffer unit 170 is activated in response to the upper byte enable signal UB_EN and the lower byte enable signal LB_EN.

Figure 10:
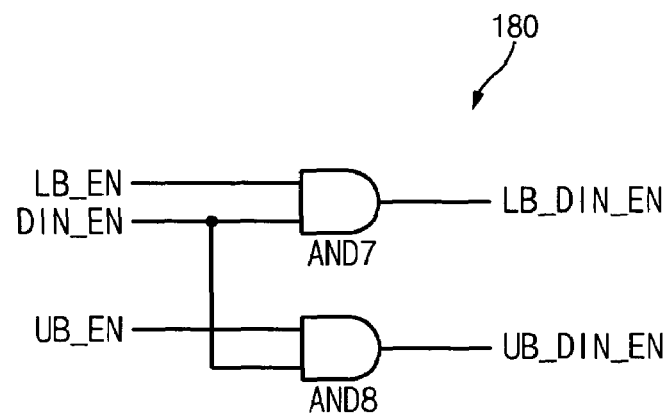
FIG. 10 is a circuit diagram of a data input buffer unit of FIG. 3.

FIG. 10 is a circuit diagram of the data input buffer unit 180 of FIG. 3.

The data input buffer unit 180 comprises AND gates AND7 and AND8.

The AND gate AND7 performs an AND operation on the lower byte enable signal LB_EN and the data input control signal DIN_CON to output the lower byte input enable signal LB_DIN_EN. The AND gate AND8 performs an AND operation on the upper byte enable signal UB_EN and the data input control signal DIN_CON to output the upper byte input enable signal UB_DIN_EN.

As a result, an output signal from the data input buffer unit 180 is activated in response to the upper byte enable signal UB_EN and the lower byte enable signal LB_EN.

Figure 11:
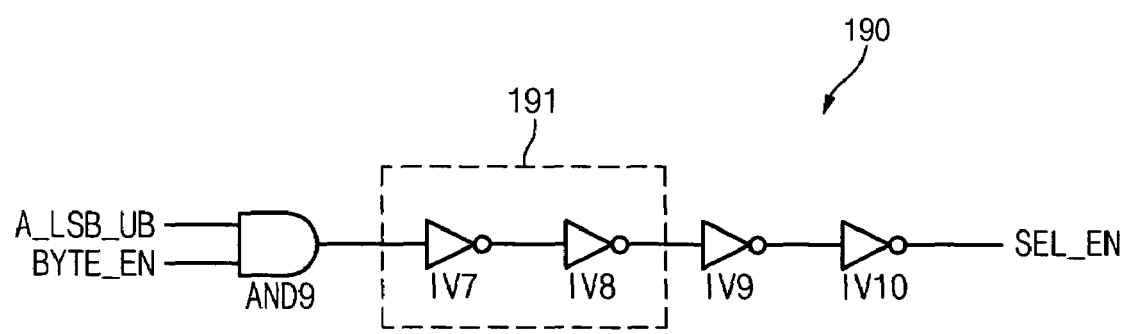
FIG. 11 is a circuit diagram of a byte conversion selecting signal generator of FIG. 3.

FIG. 11 is a circuit diagram of the byte conversion selecting signal generator 190 of FIG. 3.

The byte conversion selecting signal generator 190 comprises an AND gate AND9, a delay regulator 191 and inverters IV9 and IV10. Here, the delay regulator 191 comprises inverters IV7 and IV8.

The AND gate AND9 performs an AND operation on the byte enable signal BYTE_EN and the upper byte least significant address A_LSB_UB applied from the least significant address decoder 140. The inverters IV7~IV10 non-invert and delay an output signal from the AND gate AND9 to output the selecting enable signal SEL_EN.

Figure 12:
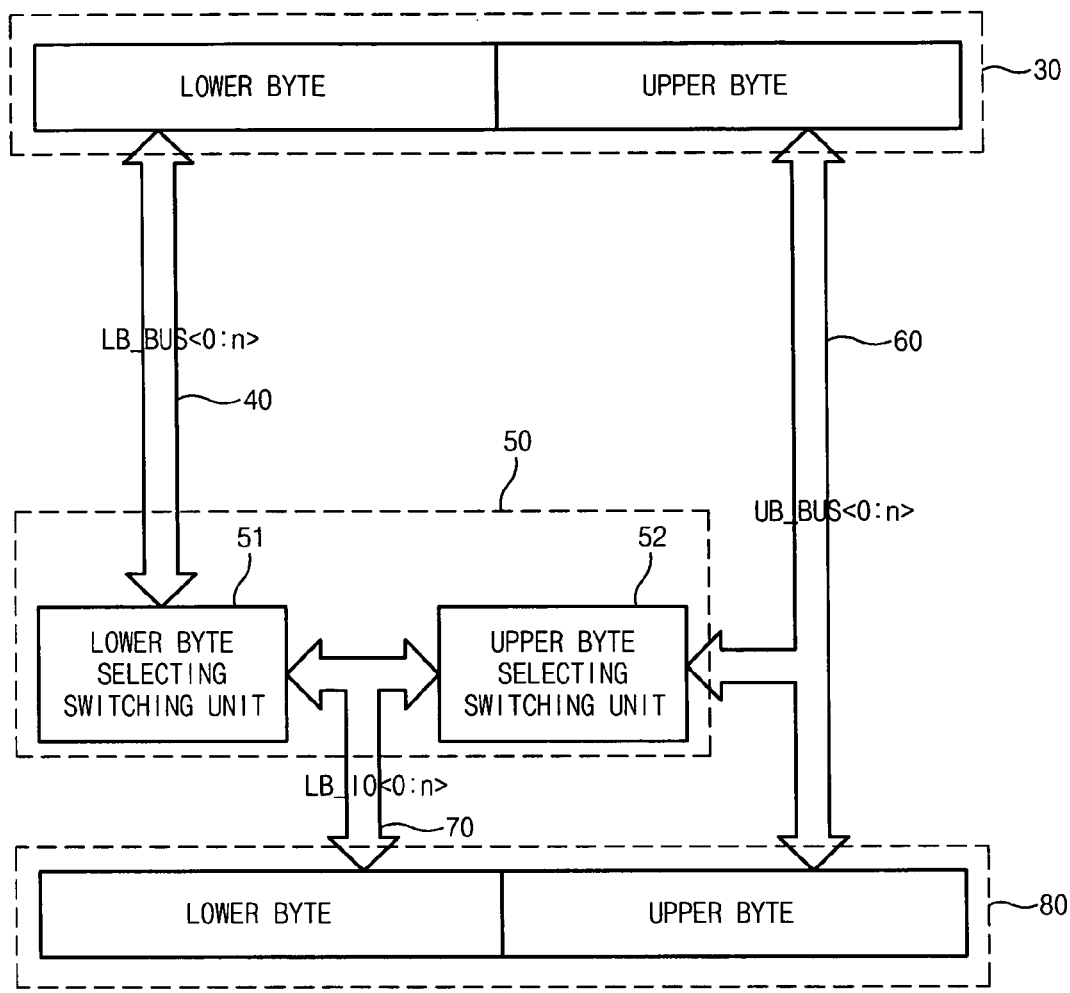
FIG. 12 is a diagram of a byte conversion switching unit of FIG. 1.

FIG. 12 is a diagram of the byte conversion switching unit 50 of FIG. 1.

The byte conversion switching unit 50 comprises a lower byte selecting switching unit 51 and an upper byte selecting switching unit 52.

The lower byte selecting switching unit 51 is connected to a lower byte region of the common data bus controller 30 through the lower byte bus 40. The upper byte selecting switching unit 52 is connected to the common data bus controller 30 and an upper byte region of the upper byte input/output buffer 82 through the upper byte bus 60. The lower byte selecting switching unit 51 and the upper byte selecting switching unit 52 are connected to the lower byte input/output buffer 81 through the lower byte input/output bus 70.

The lower byte input/output bus 70 is selectively connected to the lower byte selecting switching unit 51 or the upper byte selecting switching unit 52 in response to the selecting enable signal SEL_EN.

Figure 13:
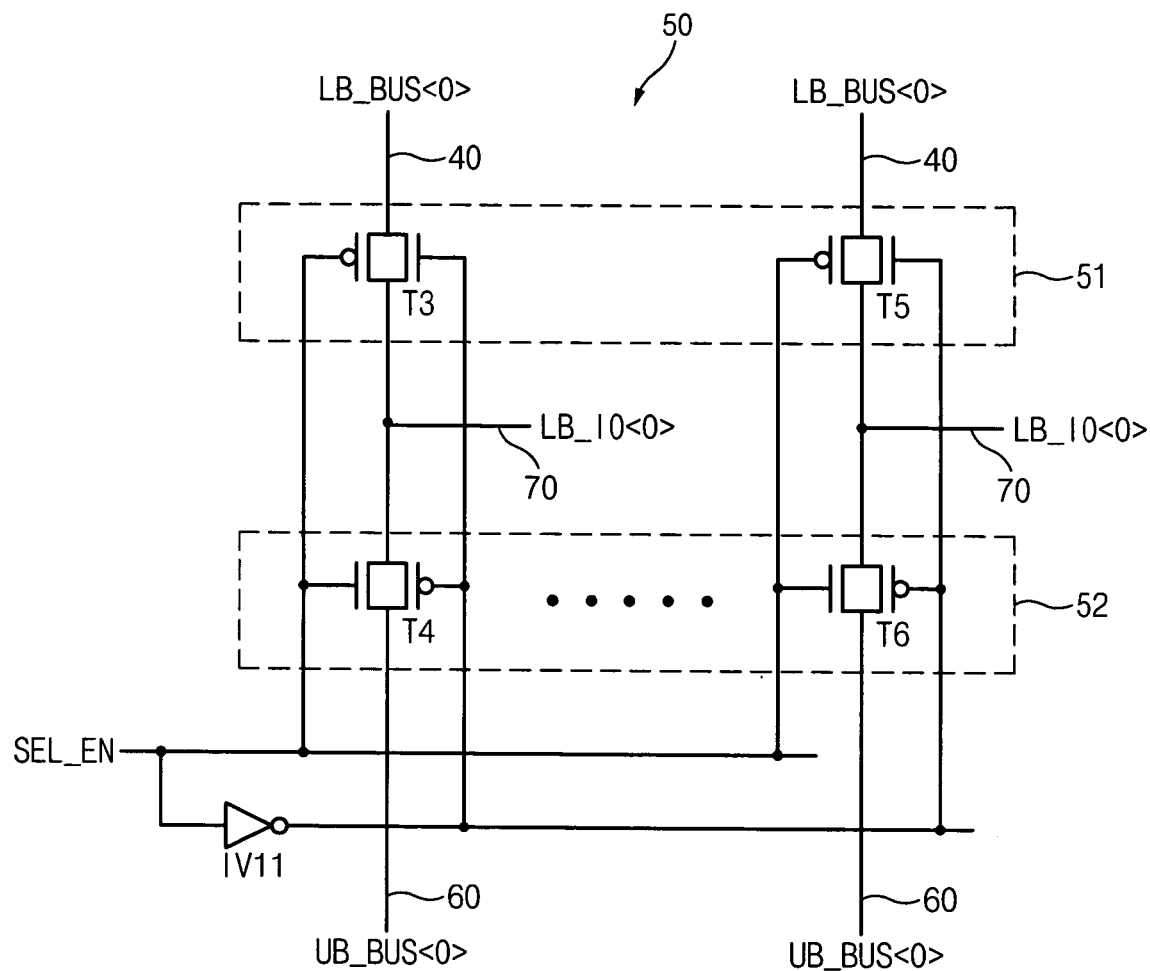
FIG. 13 is a circuit diagram of the byte conversion switching unit of FIG. 12.

FIG. 13 is a circuit diagram of the byte conversion switching unit 50 of FIG. 12.

The byte conversion switching unit 50 comprises an inverter IV11, the lower byte selecting switching unit 51 and the upper byte selecting switching unit 52.

The lower byte selecting switching unit 51 comprises transmission gates T3 and T5. The upper byte selecting switching unit 52 comprises transmission gates T4 and T6.

The transmission gates T3 and T5 having the same polarity selectively connects lower byte input/output buses 70 LB_IO<0:n> to lower byte buses 40 LB_BUS<0:n> in response to the selecting enable signal SEL_EN.

The transmission gates T4 and T6 having the opposite polarity to the transmission gates T3 and T5 selectively connects the lower byte input/output buses 70 LB_IO<0:n> to the upper byte buses 60 UB_BUS<0:n> in response to the selecting enable signal SEL_EN.

When the selecting enable signal SEL_EN is enabled, the upper byte selecting switching unit 52 is activated. When the selecting enable signal SEL_EN is disabled, the lower byte selecting switching unit 51 is activated. Here, the byte conversion switching unit 50 outputs one byte of the upper byte or the lower byte into the lower byte input/output bus 70.

The delay regulator 191 of FIG. 11 delays the byte enable signal BYTE_EN or the upper byte least significant address A_LSB_UB for a predetermined time. As a result, a switching conversion time of the lower byte selecting switching unit 51 and the upper byte selecting switching unit 52 can be regulated.

Figure 14:
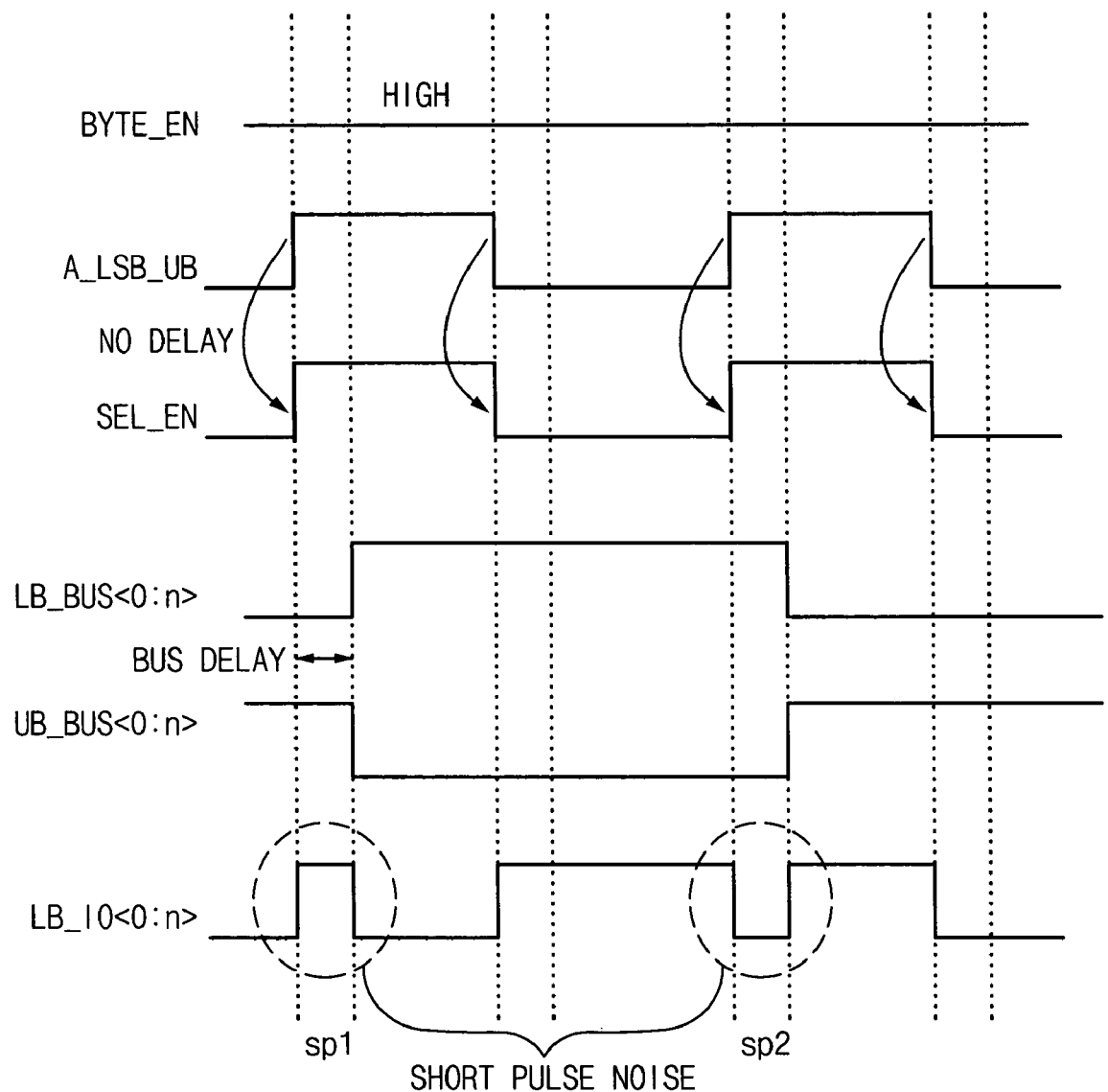
FIGS. 14 and 15 are timing diagram illustrating the operation of the byte conversion switching unit of FIG. 13.

FIG. 14 is a timing diagram illustrating the operation of the byte conversion switching unit 50 of FIG. 13 when does not comprise the delay regulator 191.

While the byte enable signal BYTE_EN is maintained at a high level, if the upper byte least significant address A_LSB-UB is inputted, the selecting enable signal SEL_EN is outputted.

After the selecting enable signal SEL_EN is enabled and delayed for a delay time of the bus, the lower byte buses 40 LB_BUS<0:n> are activated. And, after the selecting enable signal SEL_EN is enabled and delayed for a delay time of the bus, the upper byte buses 60 UB_BUS<0:n> are inactivated. When the selecting enable signal SEL_EN is outputted without delay after input of the upper byte least significant address A_LSB_UB, the selecting enable signal SEL_EN is enabled earlier than when the upper byte buses 60 UB_BUS<0:n> or the lower byte buses 40 LB_BUS<0:n> are activated.

As a result, the previous unavailable data which remain in the lower byte bus 40 and the upper byte bus 60 are outputted with a short pulse type into the lower byte input/output bus 70. When the upper byte bus 60 or the lower byte bus 40 is activated, available data are outputted into the lower byte input/output bus 70. Thus, short pulse noises sp1 and sp2 are generated in the lower byte input/output bus 70.

Figure 15:
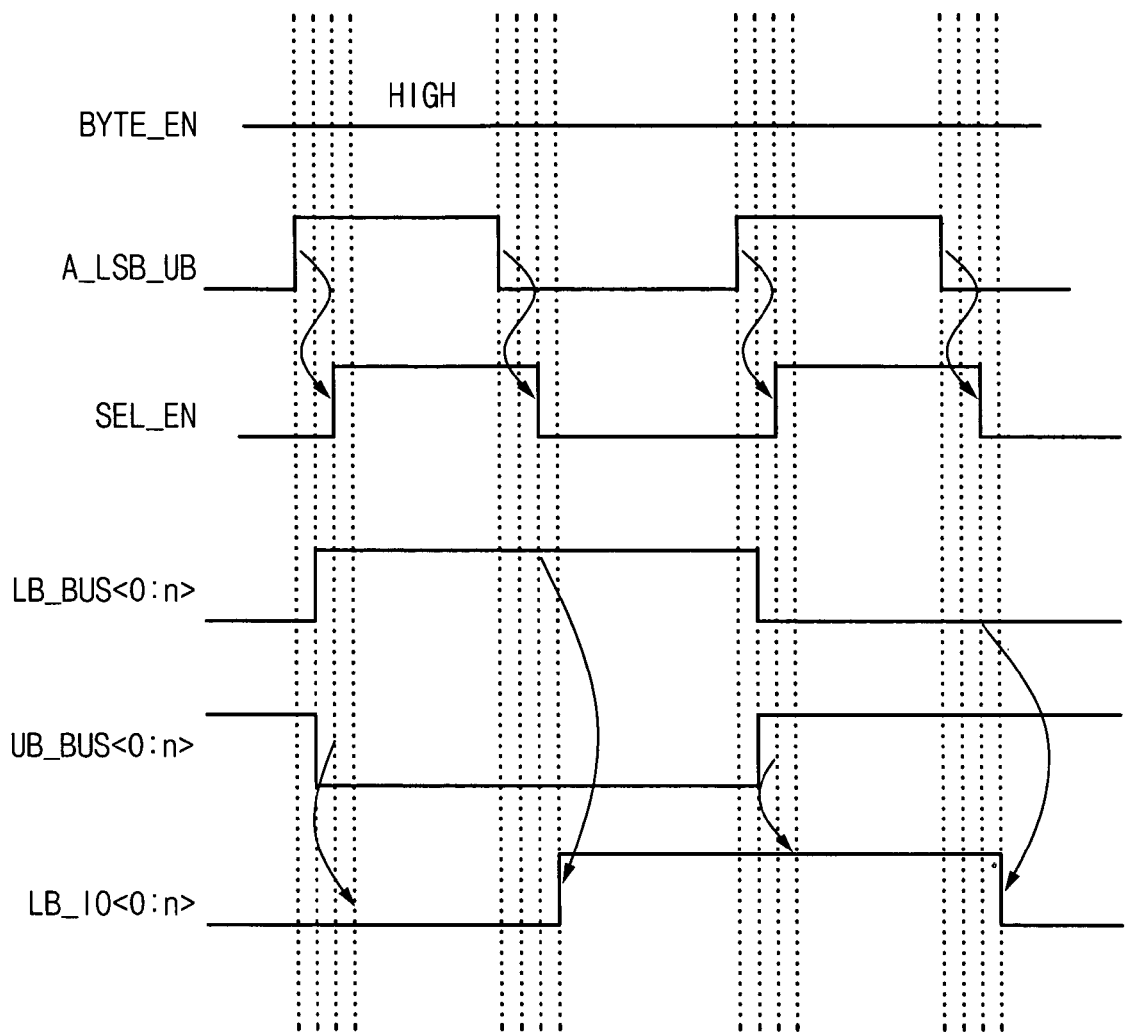

FIG. 15 is a timing diagram illustrating the operation of the byte conversion switching unit 50 of FIG. 13 which comprises the delay regulator 191.

The selecting enable signal SEL_EN is enabled later for a delay time of the delay regulator 191 than the upper byte least significant address A_LSB_EN. The lower byte bus 40 and the upper byte bus 60 are activated earlier for a determined time than when the selecting enable signal SEL_EN is activated. As a result, no short pulse noise is generated in the lower byte input/output bus 70.

Figure 16:
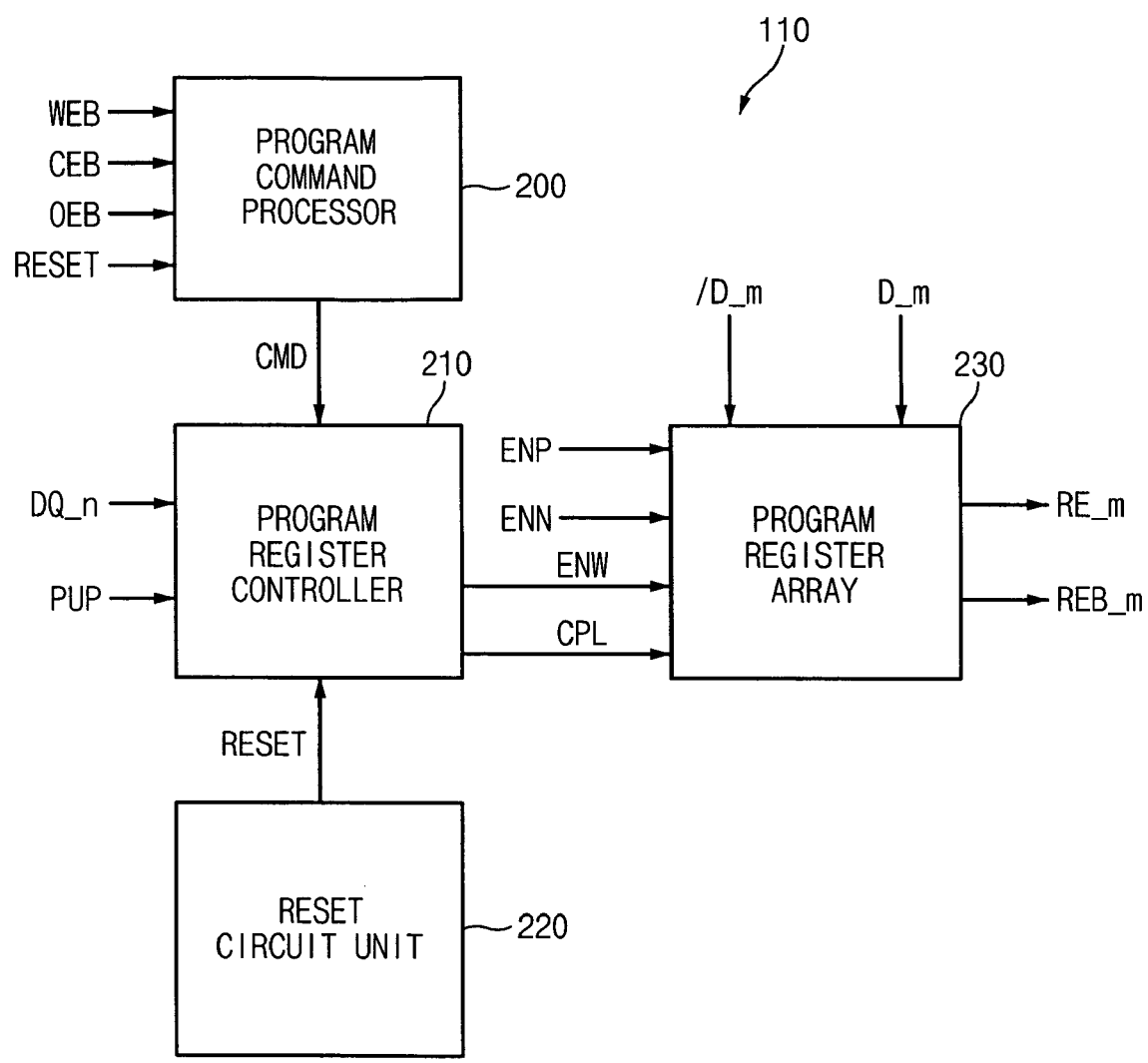
FIG. 16 is a diagram of a FeRAM register of FIG. 3.

FIG. 16 is a diagram of a FeRAM register 110 of FIG. 3.

The FeRAM register 110 comprises a program command processor 200, a program register controller 210, a reset circuit unit 220 and a program register array 230.

The program command processor 200 codes program commands in response to a write enable signal WEB, the chip enable signal CEB, an output enable signal OEB and a reset signal RESET, and outputs a command signal CMD. The program register controller 210 logically combines the command signal CMD, a power-up detecting signal PUP and input data DQ_n, and outputs a write control signal ENW and a cell plate signal CPL.

In a power-up mode, the reset circuit unit 220 outputs the reset signal RESET into the program register controller 210. The program register array 230 programs externally inputted data D_m and /D_m in response to a pull-up enable signal ENP, a pull-down enable signal ENN, a write control signal ENW and a cell plate signal CPL, and outputs register control signals RE_m and REB_m.

If the command signal CMD is generated from the program command processor 200, the program register controller 210 changes or sets configuration data of a program in the program register array 230.

The reset circuit unit 220 generates the reset signal RESET in the power-up mode, thereby activating the program register controller 210. Control signals outputted from the program register controller 210 are to initialize nonvolatile data of the program register array 230.

Figure 17:
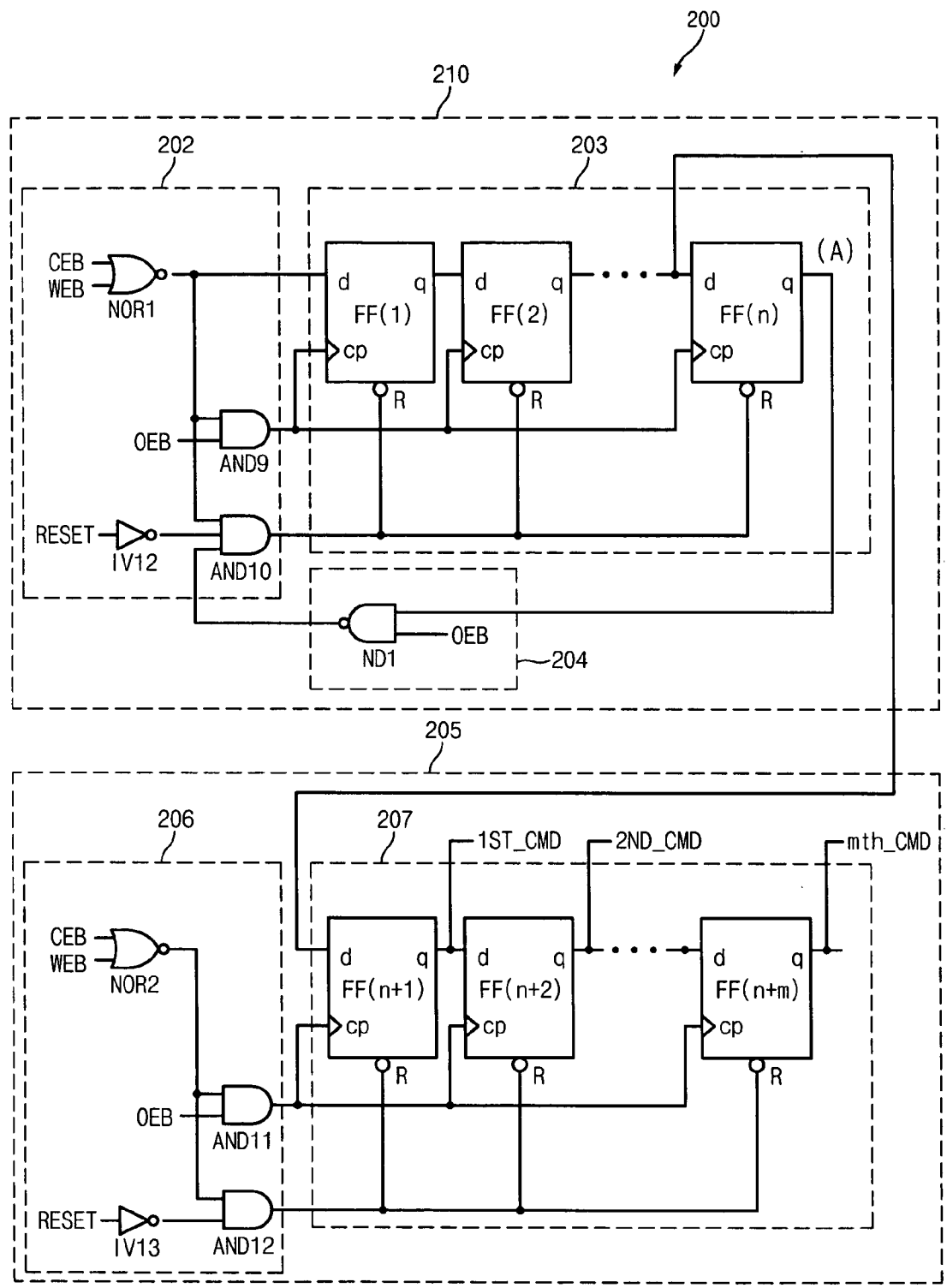
FIG. 17 is a diagram of a program command processor of FIG. 16.

FIG. 17 is a diagram of the program command processor 200 of FIG. 16.

The program command processor 200 comprises a command controller 201 and a multiple command generator 205.

The command controller 201 comprises a logic unit 202, a flip-flop unit 203 and an overtoggle detector 204.

The logic unit 202 comprises an NOR gate NOR1, AND gates AND9 and AND10 and an inverter IV12. The NOR gate NOR1 performs an NOR operation on the write enable signal WEB and the chip enable signal CEB. The AND gate AND9 performs an AND operation on an output signal from the NOR gate NOR1 and the output enable signal OEB. The AND gate AND10 performs an AND operation on the output signal from the NOR gate NOR1, the reset signal RESET inverted by the inverter IV12 and an output signal from the overtoggle detector 204.

The flip-flop unit 203 comprises a plurality of flip-flops FF connected serially. Each flip-flop has an input terminal d to receive the output signal from the NOR gate NOR1 and an output terminal q. A command signal CMD is outputted through a node A of the flip-flop. Also, each flip-flop FF has an input terminal cp to receive an activation synchronizing signal outputted from the AND gate AND9, and a reset terminal R to receive a reset signal outputted from the AND gate AND10.

Here, the input terminal cp of the flip-flop FF receives the output enable signal OEB when the chip enable signal CEB and the write enable signal WEB are at a low level. The reset terminal R of the flip-flop FF receives a low level signal if one of the chip enable signal CEB and the write enable signal WEB becomes at a high level. In the power-up mode, the flip-flop FF is reset while the reset signal RESET is at a high level.

The overtoggle detector 204 comprises an NAND gate ND1 for performing an NAND operation on the output signal from the node A and the output enable signal OEB. The overtoggle detector 204 resets the flip-flop unit 203 when the output enable signal OEB toggles over n times to cause overtoggle. Therefore, the number of toggle in the program command processor 200 is set to be different.

The multiple command generator 205 comprises a logic unit 206 and a flip-flop unit 207.

The logic unit 206 comprises an NOR gate NOR2, AND gates AND11 and AND12 and an inverter IV13. The NOR gate NOR2 performs an NOR operation on the write enable signal WEB and the chip enable signal CEB. The AND gate AND11 performs an AND operation on an output signal from the NOR gate NOR2 and the output enable signal OEB. The AND gate AND12 performs an AND operation on the output signal from the AND gate AND12 and the reset signal RESET inverted by the inverter IV13.

The flip-flop unit 207 comprises a plurality of flip-flops FF connected serially. The flip-flop FF(n+1) has an input terminal d to receive an output signal from the flip-flop FF(2) of the command controller 201. Through input terminals d and output terminals q serially connected each other, a high pulse outputted from the flip-flop FF(n+1) sequentially moves into the next flip-flop. As a result, the flip-flops FF sequentially output a plurality of command signal such as a $1^{st}$_CMD, a $2^{nd}$_CMD, . . . , a $m^{th}$_CMD.

Each flip-flop has an input terminal cp to receive an activation synchronization signal outputted from the AND gate AND11, and a reset terminal R to receive a reset signal outputted from the AND gate AND12.

When the chip enable signal CEB and the write enable signal WEB are at a low level, the output enable signal OEB is inputted into the input terminal cp of each flip-flop FF.

When one of the chip enable signal CEB or write enable signal WEB becomes at a high level, a low level signal is inputted into the reset terminal R of each flip-flop FF, and the flip-flop is reset. While the reset signal RESET is at a high level, the flip-flop FF is reset in the power-up mode.

Figure 18:
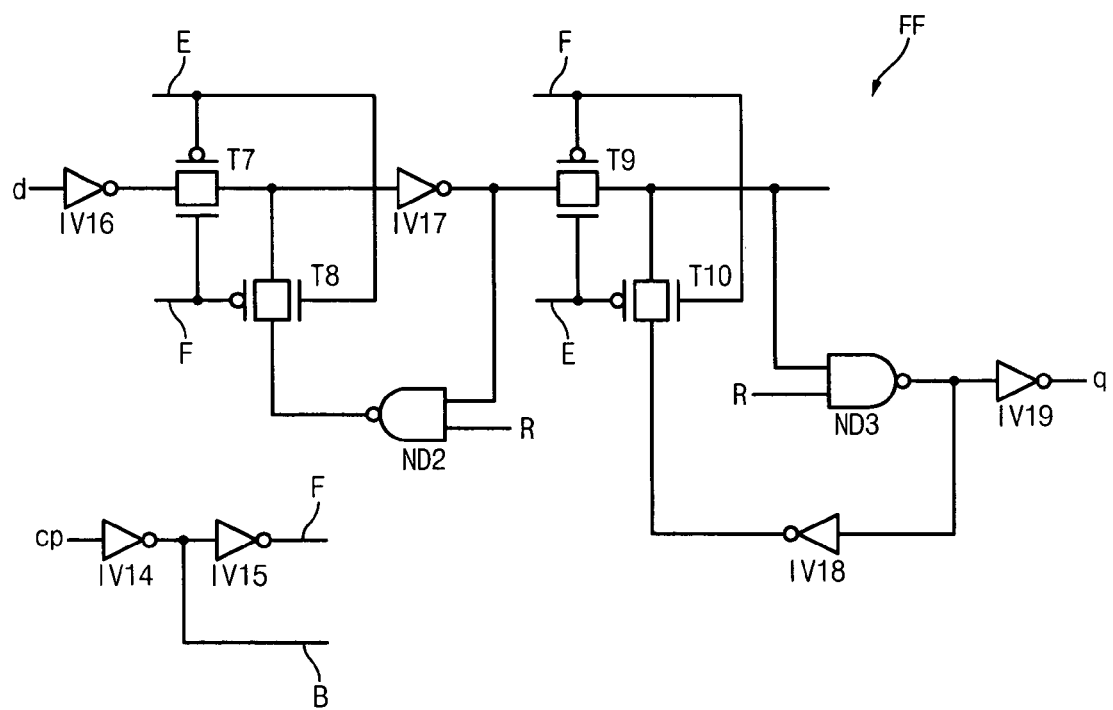
FIG. 18 is a circuit diagram of a flip-flop of FIG. 17.

FIG. 18 is a circuit diagram of the flip-flop FF of FIG. 17.

The flip-flop FF comprises transmission gates T7~T10, NAND gates ND2 and ND3, and inverters IV14~IV19. Here, the inverter IV14 inverts an output signal from the input terminal cp, and the inverter IV15 inverts an output signal from the inverter IV14.

The transmission gate T7 selectively outputs an output signal from the input terminal d inverted by the inverter IV16 depending on output states of nodes E and F. The NAND gate ND2 performs an NAND operation on output signal from the inverter IV17 and the reset terminal R. The transmission gate T8 selectively outputs an output signal from the NAND gate ND2 depending on the output states of the node E and F.

The transmission gate T9 selectively outputs an output signal from the inverter IV17 depending on the output states of the node E and F. The NAND gate ND3 performs an NAND operation on output signals from the transmission gate T10 and the reset terminal R.

The transmission gate T10 selectively outputs an output signal from the inverter IV18 depending on the output states of the node E and F. The inverter IV19 inverts an output signal from the NAND gate ND3, and outputs the inverted signal into the output terminal q.

Data inputted from the input terminal d move rightward whenever a control signal inputted through the input terminal cp toggles once. When a low level signal is inputted into the reset terminal R, a low level signal is outputted into the output terminal q to reset the flip-flop FF.

Figure 19:
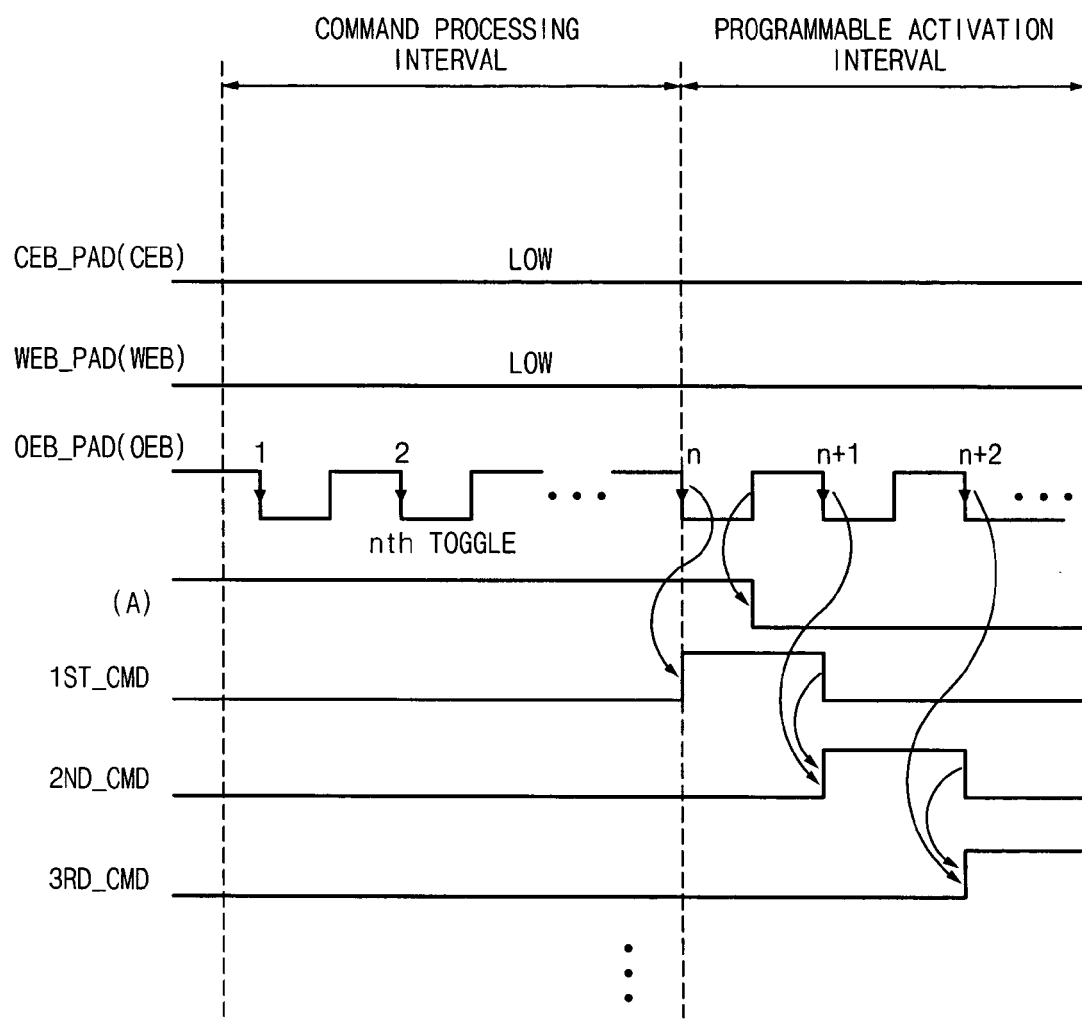
FIG. 19 is a timing diagram of the program command processor of FIG. 17.

FIG. 19 is a timing diagram of the program command processor 200 of FIG. 17.

In a command processing interval, the chip enable signal CEB and the write enable signal WEB are maintained at a low level. While the output enable signal OEB toggles n times, the command signal CMD is maintained at a disable state.

Thereafter, if an programmable activation interval starts and the output enable signal OEB toggles n times, the command signal $1^{st}\_CMD$ outputted from the flip-flop FF(n+1) is enabled to a high level.

If the overtoggle detector 204 detects overtoggle after the $n^{th}$ toggle, the output signal of the node A is disabled. Here, since an output signal of the flip-flop FF(n−1) is inputted into the flip-flop FF(n+1), the multiple command generator 205 is not affected by the overtoggle detector 413.

Next, if the $(n+1)^{th}$ toggle occurs, the command signal $1^{st}\_CMD$ is disabled, and the command signal $2^{nd}\_CMD$ outputted from the flip-flop FF(n+2) is enabled to a high level.

When the number of toggles of the output enable signal OEB is regulated, the number of flip-flops FF connected serially is regulated.

Figure 20:
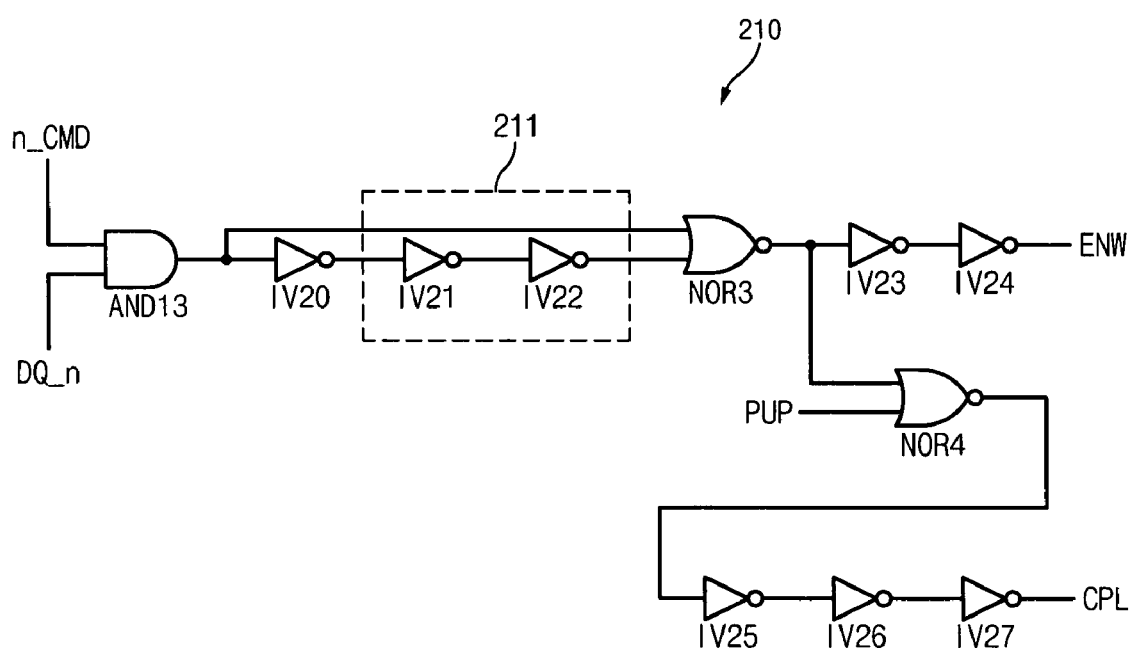
FIG. 20 is a circuit diagram of a program register controller of FIG. 16.

FIG. 20 is a circuit diagram of the program register controller 210 of FIG. 16.

The program register controller 210 comprises an AND gate AND11, inverters IV20~IV27, and NOR gates NOR3 and NOR4. The AND gate AND11 performs an AND operation on the command signal $n^{th}\_CMD$ and input data DQ_n. The inverters IV20~IV22 invert and delay an output signal from the AND gate AND13.

The NOR gate NOR3 performs an NOR operation on output signals from the AND gate AND13 and a delay unit 211 comprising the inverters IV21 and IV22. The inverter IV23 and IV24 delay an output signal from the NOR gate NOR3 to output the write control signal ENW.

The NOR gate NOR4 performs an NOR operation on an output signal from the NOR gate NOR3 and the power-up detecting signal PUP. The inverters IV25~IV27 invert and delay an output signal from the NOR gate NOR4 to output the cell plate signal CPL.

Here, the power-up detecting signal PUP is to reset the register after data stored in the register are read in the initial reset mode.

If the input data DQ_n are toggled by using an input pad after the command signal $n^{th}\_CMD$ is activated to a high level, the write control signal ENW and the cell plate signal CPL having a pulse width for a delay time of the delay unit 211.

Figure 21:
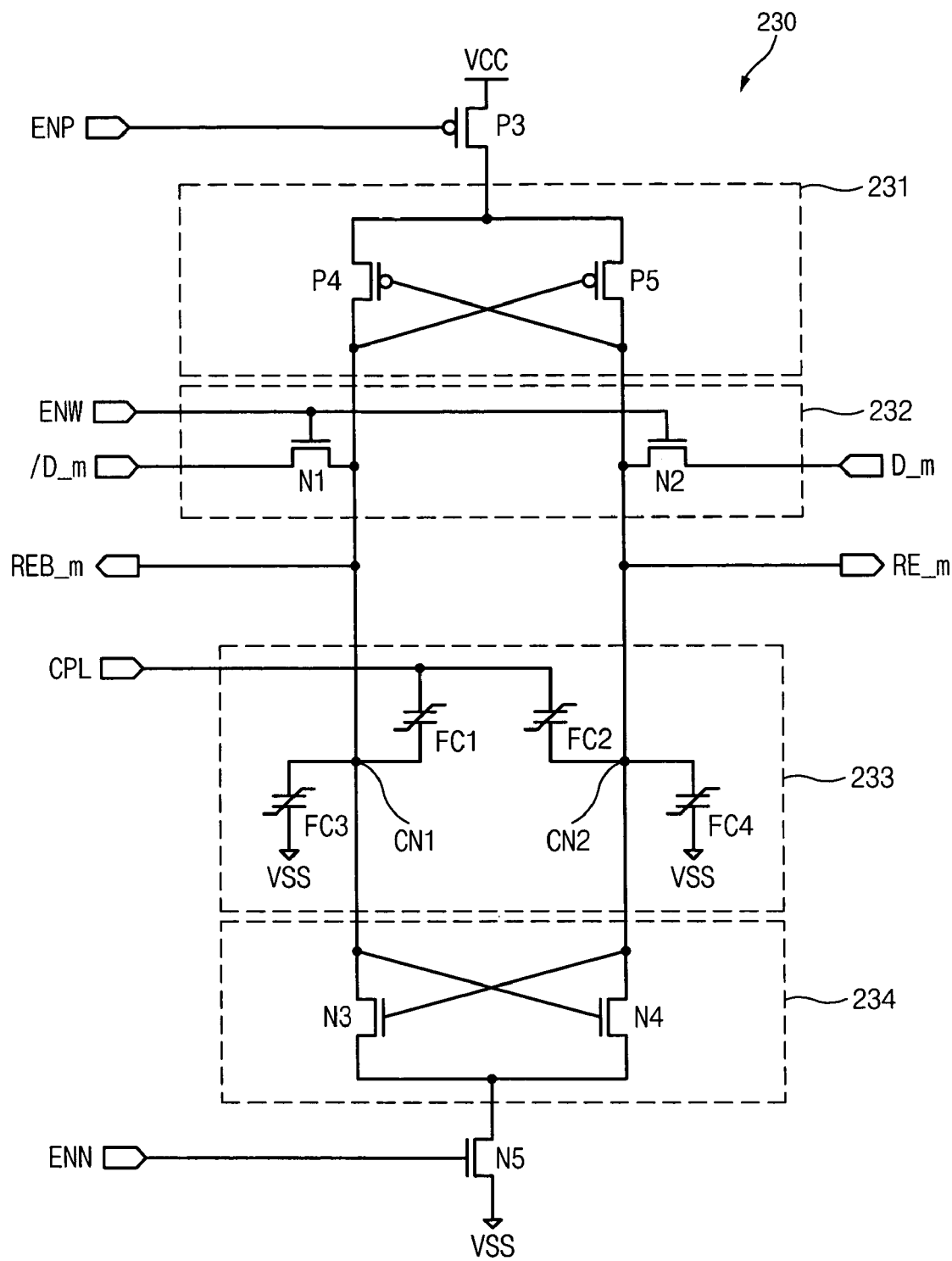
FIG. 21 is a circuit diagram of a program register array of FIG. 16.

FIG. 21 is a circuit diagram of the program register array 230 of FIG. 16.

The program register array 230 comprises a pull-up switch P3, a pull-up driver 231, a write enable controller 232, a ferroelectric capacitor unit 233, a pull-down driver 234 and a pull-down switch N5.

The pull-up switch P3, connected between the power voltage terminal and the pull-up driver 231, has a gate to receive the pull-up enable signal ENP. The pull-up driver 231, connected between the pull-up switch P3 and the write enable controller 232, comprises PMOS transistors P4 and P5 connected with a latch structure between nodes CN1 and CN2.

The write enable controller 232 comprises NMOS transistors N1 and N2. The NMOS transistors N1, connected between a data /D_m input terminal and the node CN1, receives the write control signal ENW, and the NMOS transistor N2, connected between a data D_m input terminal and the node CN2, receives the write control signal ENW.

The ferroelectric capacitor unit 233 comprises nonvolatile ferroelectric capacitors FC1~FC4. The nonvolatile ferroelectric capacitor FC1 has one terminal connected to the node CN1 and the other terminal to receive the cell plate signal CPL. The nonvolatile ferroelectric capacitor FC2 has one terminal connected to the node CN2 and the other terminal to receive the cell plate signal CPL.

The nonvolatile ferroelectric capacitor FC3 is connected between the node CN1 and the ground voltage terminal, and the nonvolatile ferroelectric capacitor FC4 is connected between the node CN2 and the ground voltage terminal. Here, the nonvolatile ferroelectric capacitors FC3 and FC4 may be selectively added depending on loading level control of the nodes CN1 and CN2.

The pull-down driver 234, connected between the ferroelectric capacitor unit 233 and the pull-down switch N5, comprises NMOS transistors N3 and N4 connected with a latch structure between the nodes CN1 and CN2. The pull-down switch N5, connected between the pull-down driver 234 and the ground voltage VSS terminal, has a gate to receive the pull-down enable signal ENN. The program register array 230 outputs control signals REB_m and RE_m through an output terminal.

Figure 22:
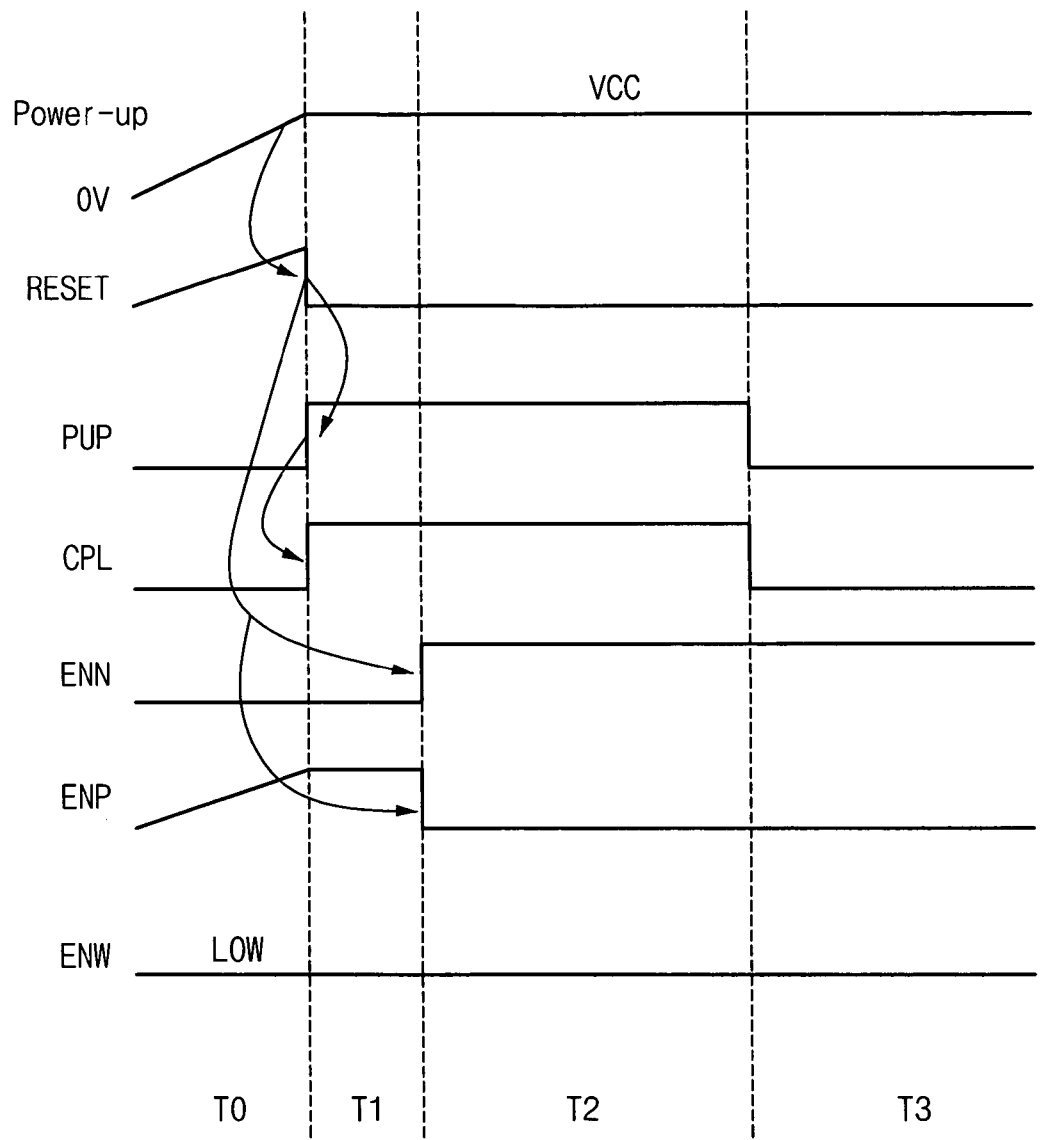
FIG. 22 is a timing diagram illustrating the power-up mode of the FeRAM register of FIG. 3.

FIG. 22 is a timing diagram illustrating the power-up mode of the FeRAM register of FIG. 3.

In an interval T1 after the power-up mode, when power reaches a stabilized power voltage VCC level, the reset signal RESET is disabled and the power-up detecting signal PUP is enabled.

Then, the cell plate signal CPL transits to a high level as the power-up detecting signal PUP is enabled. Here, charges stored in the nonvolatile ferroelectric capacitors FC1 and FC2 of the program register array 230 generate voltage difference between the nodes CN1 and CN2 by capacitance load of the nonvolatile ferroelectric capacitors FC3 and FC4.

If an interval T2 where sufficient voltage difference is generated in the nodes CN1 and CN2 starts, the pull-down enable signal ENN is enabled to a high level, and the pull-up enable signal ENP is disabled to a low level. As a result, data of the nodes CN1 and CN2 are amplified.

Thereafter, if an interval T3 starts and data amplification of nodes CN1 and CN2 is completed, the power-up detecting signal PUP and the cell plate signal CPL transits to the low level again. As a result, the destroyed high data of the nonvolatile ferroelectric capacitor FC1 or FC2 are restored. Here, the write control signal ENW is maintained at the low level to prevent external data from being re-written.

Figure 23:
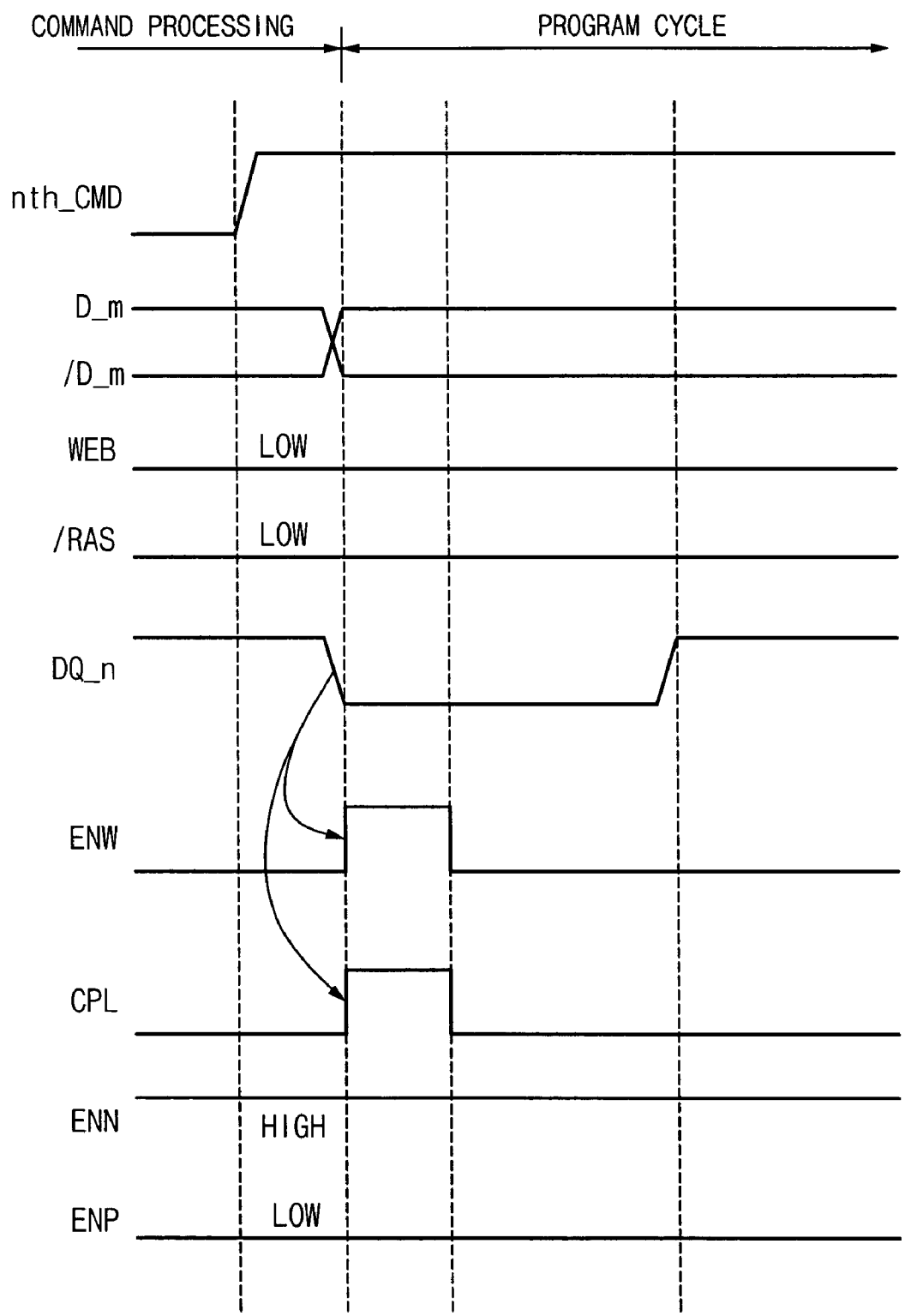
FIG. 23 is a timing diagram illustrating the program operation on the FeRAM register of FIG. 3.

FIG. 23 is a timing diagram illustrating the program operation after the command signal $n^{th}\_CMD$ is activated to a high level.

If a predetermined time passes after the command signal $n^{th}\_CMD$ is activated to a high level, new data D_m and /D_m are inputted. If the input data DQ_n applied from the data input/output pad is disabled from a high to low level, the program cycle starts. As a result, the write control signal ENW to write new data in the register and the cell plate signal CPL transit to a high level. Here, the pull-down enable signal ENN is maintained at the high level, and the pull-up enable signal ENP is maintained at the low level.

If the command signal $n^{th}\_CMD$ having a high level is inputted into the program register controller 210, signal input from the program command processor 200 is prevented. As a result, the program operation can be performed while no more control command is inputted.

As described above, in an input/output byte control device using a nontolatile ferroelectric register according to an embodiment of the present invention, data input/output can be effectively changed to be appropriate to various system requirements. In other words, both characteristics of volatile SRAM and nonvolatile flash memory can be embodied in a single chip. If the input/output byte control device is applied to a SRAM, a plurality of byte buses are selectively activated using wide bytes. When the input/output byte control device is applied to a flash memory, data can be inputted/outputted using a single byte bus. As a result, the whole layout as well as the chip cost can be reduced. In addition, programs can be changed in response to command signals using a nonvolatile ferroelectric register when bytes of input/output data are controlled.

What is claimed is:

1. An input/output byte control device using a nonvolatile ferroelectric register, comprising:
    an input/output byte controller for outputting a plurality of control signals depending on byte information of input/output data programmed in a nonvolatile ferroelectric register;
    a pad array unit comprising an upper byte region and a lower byte region; and
    a byte conversion switching means for transmitting input/output data having variable byte size between a common data bus and the pad array unit in response to the plurality of control signals.

* * * * *